United States Patent [19]

Arst et al.

[11] Patent Number: 5,110,757
[45] Date of Patent: May 5, 1992

[54] FORMATION OF COMPOSITE MONOSILICON/POLYSILICON LAYER USING REDUCED-TEMPERATURE TWO-STEP SILICON DEPOSITION

[75] Inventors: Margareth C. Arst, Palo Alto; Teh-Yi J. Chen, Cupertino; Kenneth N. Ritz, Santa Clara; Shailesh S. Redkar, Mountain View, all of Calif.

[73] Assignee: North American Philips Corp., New York, N.Y.

[21] Appl. No.: 630,140

[22] Filed: Dec. 19, 1990

[51] Int. Cl.$^5$ .............................................. H01L 21/20
[52] U.S. Cl. ........................................ 437/89; 437/99; 437/108; 437/233; 148/DIG. 25; 148/DIG. 27
[58] Field of Search .................... 437/89, 99, 108, 233; 148/DIG. 25, DIG. 27

[56] References Cited

U.S. PATENT DOCUMENTS

| | | | |
|---|---|---|---|
| 3,600,651 | 8/1971 | Duncan | 437/89 |
| 4,270,960 | 6/1981 | Bollen et al. | 427/86 |
| 4,497,683 | 2/1985 | Celler et al. | |
| 4,637,127 | 1/1987 | Kurogi et al. | 148/DIG. 27 |
| 4,698,316 | 10/1987 | Corboy, Jr. et al. | 437/89 |
| 4,728,389 | 3/1988 | Logar | 437/173 |
| 4,855,258 | 8/1989 | Allman et al. | 437/241 |
| 4,882,294 | 11/1989 | Christenson | 437/970 |
| 4,966,861 | 10/1990 | Mieno et al. | 437/99 |
| 4,986,787 | 1/1991 | Olivier et al. | 437/64 |

FOREIGN PATENT DOCUMENTS

| | | | |
|---|---|---|---|
| 0105227 | 6/1985 | Japan | 437/89 |
| 0184814 | 2/1986 | Japan | |
| 0269308 | 11/1986 | Japan | |
| 0290123 | 12/1987 | Japan | 437/89 |
| 0133615 | 6/1988 | Japan | |
| 0112723 | 5/1989 | Japan | |

OTHER PUBLICATIONS

Diguichi et al., "Advanced Bipolar Process Using Selective Poly-and Epitaxial-Si (SPEG) Technique", Tech. Dig., 1987, Int'l Elec. Devs, 1987, 835-37.
Mieno et al., "Low Temperature Epitaxy Using Si$_2$H$_6$", Extended Abs, Electrochem. Soc., vol. 87-1, Abst. 258, 1987, pp. 374-375.
Yamataki et al., "Epitaxially Grown Base Transistor for High-Speed Operation", IEEE Elec. Dev. Lett., Nov. 1987, pp. 528-530.
Nakazato et al., "A 3 GHz Lateral PNP Transistor", Tech. Dig., Int'3 l Elec. Devs. Mtg., 1986, pp. 416-419.
Borland et al., "Advanced Dielectric Isolation Through Selective Epitaxial Growth Techniques", Solid State Tech., Aug. 1985, pp. 141-148.
"Smooth Polysilicon Films Using Dichlorosilane", IBM Tech. Discl. Bull., Sep. 1986, pp. 1689-1691.
Claassen et al., "The Nucleation of CVD Silicon on SiO$_2$ and Si$_3$N$_4$ Substrates, I. The SiH$_4$-Hcl-H$_2$ System at High Temperatures", J. Electrochem. Soc., Solid-State Sci. and Tech., Jan. 1980, pp. 194-202.
Wolf et al., Silicon Processing for the VLSI Era (Lattice Press, 1986), vol. 1, pp. 133-136 and 155-156.
Mieno et al., "Novel Selective Poly and . . . ", Tech. Dig., 1987, Int'l Elec Devs. Mtg., 1987, pp. 16-19.

Primary Examiner—Brian E. Hearn
Assistant Examiner—Trunk Dang
Attorney, Agent, or Firm—R. Meetin; A. Tamoshunas; J. Haken

[57] ABSTRACT

A reduced-temperature two-step silicon deposition performed at different silicon sources is used in forming a composite monosilicon/polysilicon layer (20/24/26) on a body that contains a monosilicon region (10) and an adjoining dielectric regin (12). The first step entails selectively depositing silicon, preferably using dichlorosilane as a CVD silicon source, to grow a first monosilicon layer (20) on exposed monosilicon at an average body temperature less than or equal to 950° C. Substantially no silicon accumulates on exposed dielectric material during the first step. The second step entails non-selectively depositing silicon, preferably using silane as a CVD silicon source, at an average body temperature less than or equal to 950° C. to grow a second monosilicon layer (24) on the first monosilicon layer and to simultaneously grow a polysilicon layer (26) on the exposed dielectric material.

25 Claims, 3 Drawing Sheets

FORMATION OF COMPOSITE MONOSILICON/POLYSILICON LAYER USING REDUCED-TEMPERATURE TWO-STEP SILICON DEPOSITION

FIELD OF USE

This invention relates to semiconductor manufacturing techniques and, in particular, to deposition of monocrystalline silicon ("monosilicon" or simply "MS") and polycrystalline silicon ("polysilicon" or simply "PS") on respective monosilicon and dielectric portions of a body.

BACKGROUND ART

A monolithic silicon integrated circuit ("IC") contains a group of transistors and other basic semiconductor devices formed out of a monosilicon semiconductor die having a generally flat principal surface referred to here as the upper monosilicon surface. An electrical interconnection system situated on the upper MS surface appropriately interconnects the transistors and other basic devices. The semiconductor electrodes of each transistor conventionally extend to the upper MS surface where they make electrical contact with the interconnect system.

Reducing transistor die area and increasing transistor switching speed are important objectives in modern IC development. To minimize the risk of electrical failures such as short circuits, certain lateral alignment tolerance requirements must be followed during the fabrication of an IC. In satisfying these requirements, a sizable area normally must be allocated along the upper MS surface for the transistor semiconductive electrodes to contact the interconnect system. This restricts transistor scale-down efforts. More importantly, the parasitic capacitances that occur as a result of the substantial area needed for the contacts significantly limit the switching speed.

One promising technique for overcoming the contact area problem is to furnish the semiconductor die with a composite monosilicon/polysilicon layer More specifically, monosilicon is epitaxially deposited on certain sections of the upper MS surface, while polysilicon is deposited on dielectric material overlying other sections of the upper MS surface. The deposition is usually performed according to a chemical vapor deposition ("CVD") technique. By suitably doping the composite MS/PS layer with semiconductor impurities, transistor semiconductive electrodes and PN junctions are formed in the MS portions of the composite layer The PS portions of the layer provide intermediate electrical connections between these electrodes and an electrical interconnection system formed on the layer.

For a given fabrication capability, the contacts to the semiconductive electrodes formed in the composite MS/PS layer depend much less on the lateral alignment tolerance requirements than in the more conventional IC described earlier. Use of the MS/PS layer thereby allows transistor die area to be reduced. Since a concurrent decrease occurs in the associated parasitic capacitances, a substantial increase in transistor switching speed is also possible.

Mieno et al, "Novel Selective Poly- and Epitaxial-Silicon Growth (SPEG) Technique for ULSI Processing", *Tech. Dio.*, 1987 *Int'l Elec. Devs. Mtg.*, 1987, pp. 16-19, describe one technique used for creating a structure having such a composite MS/PS layer. The starting point in Mieno et al was a body consisting of a monosilicon substrate and an overlying field dielectric region formed with silicon dioxide Parts of the substrate were exposed through openings in the oxide.

Using disilane ($Si_2H_6$) as a CVD silicon source, monosilicon was epitaxially grown on the exposed monosilicon of the body, while polysilicon was simultaneously deposited on the oxide. Hydrogen ($H_2$) served as carrier gas for the disilane. The Si deposition was apparently performed in a single step in a suitable CVD chamber. The temperature $T_B$ of the body was 830° C. during the CVD. The pressure $P_c$ of the chamber was 8000 pascal —i.e., about 60 torr. By suitably doping one such composite MS/PS layer, Mieno et al formed the base and emitter of an NPN bipolar transistor in the MS part of the layer. Mieno et al similarly formed the source and drain of an N-channel insulated-gate field-effect transistor in the MS part of another such MS/PS layer.

Thermal budget—i.e., basically the integral of time over the temperature that an IC experiences during its fabrication—is an important consideration in assessing the usefulness of a semiconductor fabrication technique such as that of Mieno et al. To achieve the shallow PN junctions (minimum dopant diffusions) needed for dense high-speed future ICs, the thermal budget generally needs to be low. If the thermal budget is too high, some of the PN junctions are driven too deep into the IC. The device performance is degraded, sometimes drastically.

The 830° C. $T_B$ during the Si deposition in Mieno et al is relatively low. Consequently, Mieno et al appear capable of attaining a low thermal budget. Their fabrication process might, at first glance, seem well suited for making high-performance ICs.

Unfortunately, the disilane used by Mieno et al as a Si source is quite explosive, especially with halides. Disilane can ignite spontaneously. It is not a desirable gas for a semiconductor fabrication area if safer gases are available. Disilane is also quite expensive. Its price is approximately ten times that of silane ($SiH_4$), another conventional CVD Si source.

Another reference of interest as background art to the present invention is Celler et al, U.S. Pat. No. 4,497,683. In Celler et al, a two-step silicon CVD is utilized to form a composite MS/PS layer on a body consisting of a monosilicon substrate and an adjoining silicon dioxide layer having openings through which the monosilicon is exposed. The first deposition step is a selective CVD in which monosilicon is epitaxially grown on the monosilicon at the bottom of the openings in order to fill them. Substantially no silicon accumulates on the oxide layer. The second deposition step entails epitaxially depositing monosilicon on the monosilicon that fills the openings and simultaneously depositing polysilicon on the oxide. Instead of directly using the resultant MS/PS layer to form a transistor, Celler et al laser recrystallize the layer in an effort to convert the polysilicon into monosilicon.

Celler et al specify that their CVD Si source may consist of silane, dichlorosilane ($SiH_2Cl_2$), trichlorosilane ($SiHCl_3$), or tetrachlorosilane ($SiCl_4$) using hydrogen as carrier gas. The CVD is performed at atmospheric pressure and at a $T_B$ of 1050° C. to 1250° C. In the principal example disclosed in Celler et al, the body was heated in hydrogen after which the first CVD step was performed at 1150° C. with tetrachlorosilane. The second CVD step was then done at 1050° C. with silane.

Although not described in the principal example, Celler et al elsewhere state that an etchant such as hydrochloric acid (HCl) is utilized during the first CVD step in order to make it selective.

Use of silane is advantageous because it is a conventional semiconductor fabrication gas. Its price is relatively low. Tetrachlorosilane is somewhat more expensive than silane but is an acceptable gas for a semiconductor fabrication area. However, the silicon CVD $T_B$ of 1050° C. or more in Celler et al is quite high. Their thermal budget is high It would be quite difficult to use the process of Celler et al in manufacturing dense high-speed future ICs.

In summary, Mieno et al achieve a low thermal budget but use an undesirable Si source. Essentially the opposite occurs in Celler et al. They employ acceptable Si sources but have an undesirably high thermal budget. A process for depositing a composite MS/PS layer on a monosilicon/dielectric body at a low thermal budget using Si sources readily amenable to semiconductor fabrication would be quite desirable.

GENERAL DISCLOSURE OF THE INVENTION

The present invention furnishes such a process. More specifically, in accordance with the invention, a reduced-temperature two-step silicon deposition is employed in forming a composite monosilicon/polysilicon layer on a body that contains a monosilicon region and an adjoining dielectric region. Part of each region is exposed at the start of the deposition. The exposed dielectric material is normally silicon dioxide.

The first step in the deposition process consists of selectively depositing silicon to grow a first monosilicon layer on the exposed monosilicon of the body at an average body temperature less than or equal to 950° C. Substantially no silicon simultaneously accumulates on the exposed dielectric material of the body. The second deposition step consists of non-selectively depositing silicon at an average body temperature less than or equal to 950° C. to grow a second monosilicon layer on the first monosilicon layer and to simultaneously form a polysilicon layer on the exposed dielectric material. The two steps are performed with silicon sources of different chemical composition. During both steps, the body temperature is usually no more 900° C. and is preferably no more than about 850° C.

The deposition pressure in the invention is normally no more than 50 torr and is preferably 25 torr or less. This pressure is achieved by utilizing a suitable low-pressure deposition chamber for both deposition steps The depositions are preferably done one directly after the other without removing the body from the chamber between the two steps.

In a preferred embodiment, the first deposition is performed by CVD using dichlorosilane as a silicon source. Due to the properties of the dichlorosilane CVD reaction, the interface between the first monosilicon layer and the underlying monosilicon of the body is substantially featureless and defect free. This is highly beneficial. A silicon etchant such as gaseous hydrochloric acid may be utilized to control the silicon growth rate during the first deposition. The second deposition is performed by CVD using silane as a silicon source.

Subsequent to creation of the composite MS/PS layer, an IC containing one or more bipolar and/or field-effect transistors is normally formed out of the resulting structure. This entail doping the MS/PS layer in such a way that transistor semiconductive electrodes are formed in the MS portion of the layer. Contacts to the transistors are made through the PS portions of the layer. Because these contacts have a relatively small dependence on the lateral alignment tolerance requirements, the transistors are very compact. The parasitic capacitances associated with the area needed for the contacts are quite small.

Turning back to the two-step Si deposition, it is performed in a highly advantageous manner. The deposition body temperature of 950° C. or less, preferably no more than 850° C., is relatively low. Accordingly, the thermal budget for the IC can be quite low. Shallow PN junctions are readily attainable. Since the parasitic capacitances are also small, the switching speed can be quite high.

The silane and dichlorosilane Si sources are both well suited to a semiconductor fabrication environment. The cost of the two gases is reasonable, silane being relatively low priced. The invention thereby achieves the advantages of Mieno et al and Celler et al while avoiding their disadvantages. In short, the present method should be quite useful in making dense high-speed ICs for stringent future applications.

BRIEF DESCRIPTION OF THE DRAWINGS

FIG. 3 corresponds to part of the structure shown in FIG. 2d.

Like reference symbols are employed in the drawings and in the description of the preferred embodiments to represent the same or very similar item or items.

DESCRIPTION OF THE PREFERRED EMBODIMENTS

In the present invention, a continuous composite monosilicon/polysilicon layer is provided on a monosilicon/silicon dioxide body according to a semiconductor fabrication process that utilizes a two-step silicon deposition at reduced temperature and low pressure to attain a low thermal budget. As used here, "monosilicon" means monocrystalline silicon in which there are less than $10^8$ defects/cm$^2$. Semiconductive electrodes for at least one transistor are normally formed in the composite MS/PS layer.

Figure 1A:
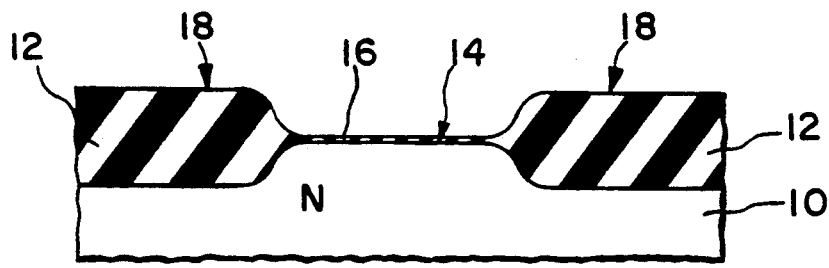
FIGS. 1a, 1b, 1c, 1d, and 1e are cross-sectional structural views representing steps in manufacturing a semiconductor structure according to the invention.

FIGS. 1a–1e illustrate a typical preferred implementation of the process. Referring to FIG. 1a, the starting point is a body created from a monosilicon substrate region 10. A recessed annular dielectric region 12 of silicon dioxide lies generally along the top of MS region 10. More precisely, field-oxide region 12 laterally surrounds an "active" portion of region 10 having a major upper surface 14. A thin electrically insulating layer 16 of silicon dioxide lies along upper MS surface 14. Field oxide 12 has a major upper surface 18.

MS region 10 is normally doped with various P-type and N-type semiconductor impurities (such as boron, arsenic, phosphorus, and antimony) depending on the characteristics of the final semiconductor device that MS region 10 and the composite MS/PS layer will be used in creating. The doping type and concentration are not material to the invention as long as the monosilicon nature region 10 is not affected. In the embodiment shown in FIG. 1a, MS region 10 is doped N-type. For example, region 10 is typically doped with arsenic or phosphorus to a resistivity of 0.3-10 ohm-cm.

Field oxide 12 is created according to the well-known LOCOS technique and typically has a thickness of 6,000-10,000 angstroms. Field oxide 12 preferably extends 4,000-6,000 angstroms below MS surface 14. The thickness of oxide layer 16 is preferably 300-1,000 angstroms.

Prior to the stage depicted in FIG. 1a, a sacrificial oxidation is normally performed on the body to smoothen MS surface 14. The sacrificial oxidation entails thermally growing a layer of silicon dioxide along surface 14 and then removing the oxide layer. Layer 16 then consists of the "native" oxide that forms along surface 14 when the body is exposed to the atmosphere. The native oxide thickness is usually less than 20 angstroms.

A preclean is also performed on the body. This typically entails immersing the body in an ammonium hydroxide solution at room temperature for 10 minutes and then cleaning the body in a solution of sulfuric acid and hydrogen peroxide at 100° C. for 10 minutes. The body is rinsed in de-ionized water to complete the preclean.

Having gotten to the stage illustrated in FIG. 1a, the body is placed in a low-pressure deposition chamber of a conventional epitaxial-growth reactor such as the AMT7100 made by Applied Materials. The pressure $P_c$ in the deposition chamber is pumped down to a value less than 50 torr and is maintained at or below 50 torr during all of the below-described steps that are performed in the chamber. During these steps, $P_c$ preferably is 25 torr.

The average temperature $T_B$ of the body is raised from room temperature to a preheat temperature greater than 800° C. but not more than about 950° C. The preheat temperature preferably is 850° C. The ramp-up to the preheat temperature preferably takes 3-5 minutes. $T_B$ is then maintained at the preheat value for a selected time, preferably 10 minutes, in order to make $T_B$ uniform throughout the body.

Without breaking vacuum in the deposition chamber (and therefore without removing the body from the chamber), a bake in hydrogen is performed on the body at a $T_B$ of no more than about 950° C. in order to break up and remove oxide layer 16. $T_B$ is preferably 950° C. during the H₂ bake. Since this is higher than the preferred preheat temperature, $T_B$ is suitably raised immediately after the preheat, preferably in 10 minutes. The bake is then done for a specified time, preferably 5 minutes, by introducing hydrogen into the deposition chamber. The H₂ flow rate preferably is 75 liters/minute.

Figure 1B:
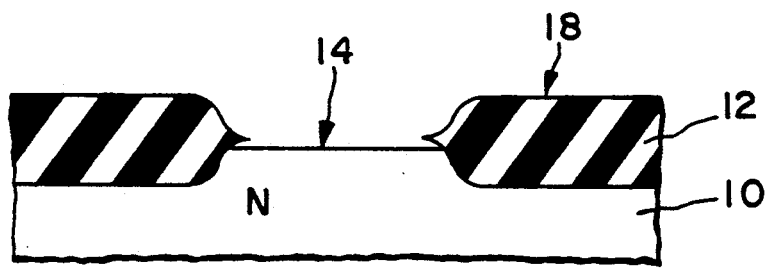
Figure 1C:
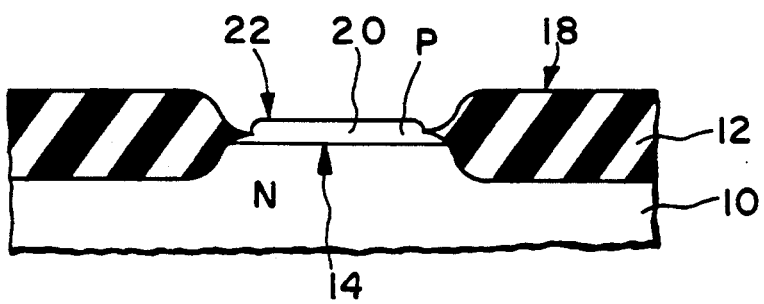

Again without breaking the chamber vacuum, the body is cleaned with a gaseous cleaning agent at a $T_B$ of no more than about 950° C. If any of oxide layer 16 is not removed during the H₂ bake, the cleaning agent removes the remainder of layer 16 in order to fully expose MS surface 14. In fact, a small thickness of monosilicon along surface 14 is usually etched away during the clean so as to lower surface 14 slightly. Upper field-oxide surface 18 is also cleaned during this step FIG. 1b shows the structure at the end of the cleaning operation $T_B$ is preferably 850° C. during the cleaning step. Because this is lower than the preferred H₂ bake temperature, $T_B$ is appropriately lowered immediately after the bake, preferably in 5 minutes. The clean is subsequently performed for a relatively short time, preferably 2 minutes, by introducing gaseous hydrochloric acid into the deposition chamber using H₂ as carrier gas. The HCl flow rate preferably is 0.75 liter/minute. The H₂ flow rate preferably is 75 liters/minute. The silicon is etched at a rate of about 150 angstroms/minute, thereby lowering surface 14 about 300 angstroms.

Once again without breaking the chamber vacuum, a two-step silicon CVD is performed on the body at a $T_B$ of no more than about 950° C. to create a composite MS/PS layer on upper surfaces 14 and 18. During both Si deposition steps, $T_B$ is normally less than or equal to 900° C. and is preferably 850° C. Since the preferred deposition temperature is the same as the preferred cleaning temperature, no $T_B$ adjustment is needed after the cleaning operation. The two-step deposition is thus done immediately after the HCl clean.

The first of the CVD steps consists of selectively depositing silicon on upper MS surface 14 to form a continuous first monosilicon epitaxial layer 20 having an upper surface 22. See FIG. 1c. Substantially no silicon accumulates on upper oxide surface 18 during this step.

Monosilicon epitaxial layer 20 serves various purposes If any monosilicon along surface 14 is removed during the cleaning step, MS layer 20 can replace the removed material. Layer 20 can compensate, as desired, for differences between the MS and PS growth rates during the second CVD (discussed in detail below). To minimize dopant out-diffusion into MS region 10 during later thermal processing, layer 20 can be grown in an undoped (i.e., intrinsic) form.

While MS layer 20 may be initially undoped in some embodiments, it may also be initially doped P-type or N-type in other embodiments depending on the desired final device characteristics. The doping type (if any) and concentration are not material to the formation of layer 20 so long as it is monosilicon in crystal structure. In the embodiment shown in FIG. 1c, layer 20 is doped P-type.

The first CVD is done by introducing dichlorosilane (SiH₂Cl₂) into the deposition chamber using hydrogen as carrier gas. The dichlorosilane decomposes to provide the silicon for layer 20. Use of dichlorosilane enables interface 14 between MS layer 20 and underlying MS region 10 to be substantially featureless and defect-free. The chlorine part of the dichlorosilane prevents any silicon from being deposited on oxide surface 18.

A separate silicon etchant, preferably gaseous hydrochloric acid, is normally introduced into the chamber during the first CVD to slow down the Si deposition rate. This makes it easier to control the thickness of MS layer 20. With HCl as the etchant, the SiH₂Cl₂ decomposition proceeds according to the following equilibrium relationship:

$$SiCl_X(gas) + K_A H_Y(gas) \rightarrow Si(solid) + K_B HCl \text{ (gas)}$$

where X, Y, $K_A$, and $K_B$ are constants dependent on the SiH₂Cl₂, HCl, and H₂ flow rates. If MS layer 20 is to be initially doped, a gas containing the desired impurity is also introduced into the chamber.

The SiH₂Cl₂ flow rate is 0.05-0.8 liter/minute, preferably 0.2 liter/minute. The HCl flow rate is 0-1.0 liter/minute, preferably 0.2 liter/minute. The H₂ flow rate is 50-150 liters/minute, preferably 70 liters/minute. For the exemplary case in which MS layer 20 is P-type, the doping is provided with boron in the form of $B_2H_6$ at a preferred flow rate of 0.03 liter/minute.

At the preferred flow rates, MS layer 20 grows at a rate of about 130 angstroms/minute. The first CVD step is performed for a selected time, 5 minutes in a preferred example. This is adequate to grow layer 20 to a thickness of about 650 angstroms.

The second CVD consists of depositing silicon to simultaneously form (a) a continuous second monosilicon epitaxial layer 24 on MS surface 22 and (b) an adjoining continuous polysilicon layer 26 on oxide surface 18. See FIG. 1d. Silicon layers 20, 24, and 26 constitute the present MS/PS layer in which (a) layers 20 and 24 form the MS portion and (b) layer 26 forms the PS portion.

Si layers 24 and 26 are both doped N-type or P-type depending on the desired final device characteristics. If MS layer 20 is initially doped, layers 24 and 26 are usually doped with the same impurity as layer 20. Consequently, layers 24 and 26 are P-type in the example depicted in FIG. 1d. As with layer 20, the doping type and concentration of layers 24 and 26 are not material to their formation as long as layer 24 is monosilicon in crystal structure.

The second deposition step is performed immediately after the first CVD by introducing silane ($SiH_4$) into the deposition chamber using hydrogen as carrier gas. The silane decomposes to provide the silicon for layers 24 and 26. A gas containing the desired impurity for layers 24 and 26 is also introduced into the chamber.

The $SiH_4$ flow rate is 0.1-0.8 liter/minute, preferably 0.2 liter/minute. The $H_2$ flow rate is 50-150 liters/minute, preferably 70 liters/minute. For the exemplary case in which the composite MS/PS layer is P-type, the doping for layers 24 and 26 is accomplished with boron in the form of $B_2H_6$ at a preferred flow rate of 0.03 liter/minute.

At the preferred flow rates, MS layer 24 grows at a rate of about 1,000 angstroms/minute, while PS layer 26 simultaneously grows about 8-10% faster These growth rates are considerably greater (about eight times greater) than the growth rate for underlying MS layer 20 at the preferred conditions during the first CVD. The second deposition step is performed for a time sufficient to grow MS layer 24 to the thickness needed for the semiconductor device that will eventually utilize composite MS/PS layer 20/24/26. The deposition time is 5-10 minutes in a preferred example. The boron concentration in MS/PS layer 20/24/26 reaches about $5 \times 10^{15}$ atoms/cm$^3$ at the preferred deposition conditions given above.

Figure 1D:
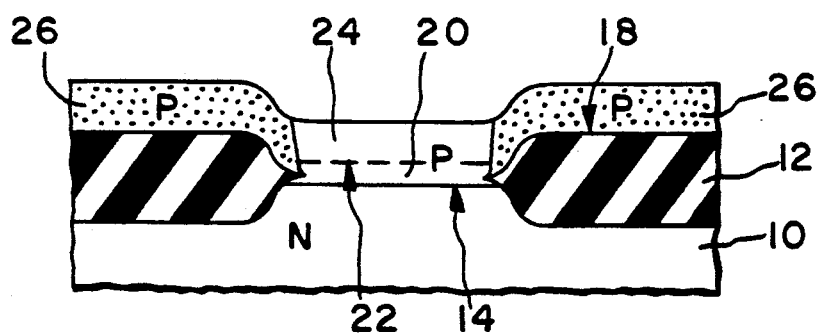

After the second CVD operation is complete, $T_B$ is ramped downward to a relatively low temperature, preferably 200° C. This preferably takes 10-15 minutes. $P_c$ is returned to atmospheric pressure after which the structure illustrated in FIG. 1d is removed from the deposition chamber.

The maximum $T_B$ which occurs during the steps performed in the deposition chamber, including the $H_2$ bake and HCl cleaning steps, is 950° C. During most of the approximate 1 hour that the body spends in the chamber at the preferred conditions, $T_B$ is 850° C. or less. Consequently, the integral of temperature over time during the steps done in the chamber is quite low. The thermal budget for the desired semiconductor device can thereby be quite low.

Figure 1E:
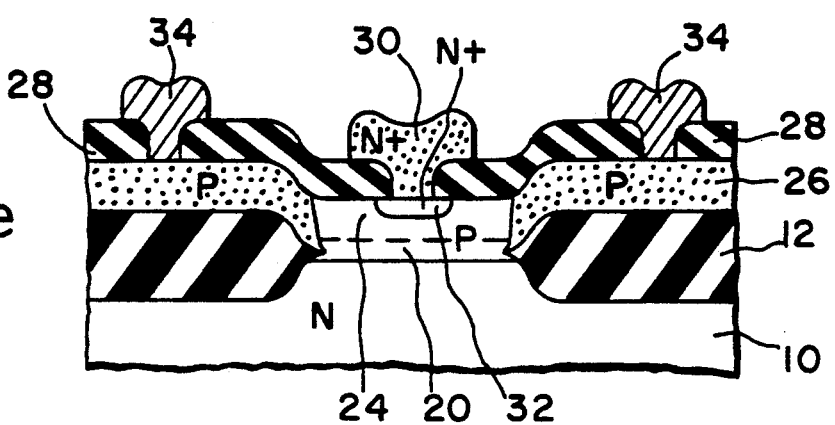

The remaining steps needed to form the desired device are now performed For example, FIG. 1e illustrates a situation in which the device is an NPN transistor. The remaining fabrication of this device entails first depositing an electrical insulating layer 28 of silicon dioxide on the top of Si layers 24 and 26. Openings are etched through oxide layer 28 down to layers 24 and 26 at the locations indicated in FIG. 1e.

A heavily doped N-type polysilicon emitter contact 30 is provided in the opening that extends down to layer 24. Part of the N-type impurity in PS emitter contact 30 diffuses into MS layer 24 to form a heavily doped N-type emitter 32. Metallic base contacts 34 are provided in the openings extending down to layer 26 In the final structure of FIG. 1e, the remaining P-type portions of MS layers 20 and 24 constitute the base for the NPN transistor. Layer 26, which still consists of polysilicon, connects the base to metallic base contacts 34. MS substrate region 10 is the collector. It connects to a heavily doped N-type collector contact not shown in FIG. 1e.

Turning to FIGS. 2a-2d, they illustrate another implementation of a semiconductor fabrication process that follows the teachings of the invention FIGS. 2a-2d respectively correspond to FIGS. 1a-1d in the previous implementation. The embodiment of FIGS. 2a-2d is performed in the manner described above for FIGS. 1a-1d except that the starting points are slightly different.

The starting point for the embodiment in FIGS. 2a-2d is a body consisting of a monosilicon substrate region 10', an overlying patterned field-oxide region 12', and thin oxide layer 16. See FIG. 2a. MS substrate region 10' is the same as region 10 except that region 10' is doped P-type instead of N-type. For example, MS region 10' is preferably doped with boron to a resistivity of 3-30 ohm-cm. Field-oxide region 12' is a version of field oxide 12 that has been planarized according to a conventional technique. Item 18' in FIG. 2a indicates the largely planarized upper surface of field oxide 12'.

Figure 2A:
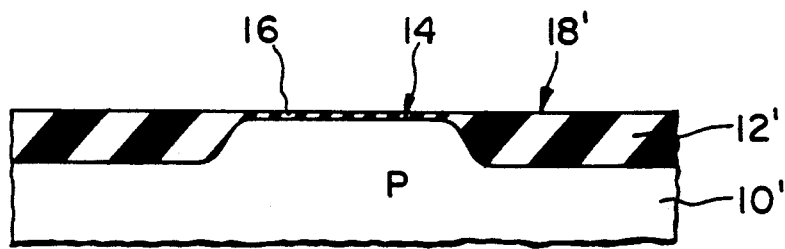
FIGS. 2a, 2b, 2c, and 2d are cross-sectional structural views representing steps in manufacturing another semiconductor structure according to the invention.
Figure 2B:
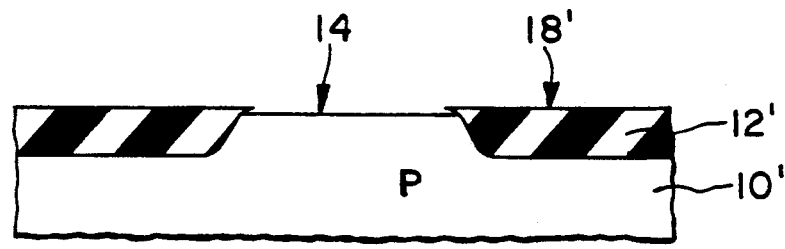
Figure 2C:
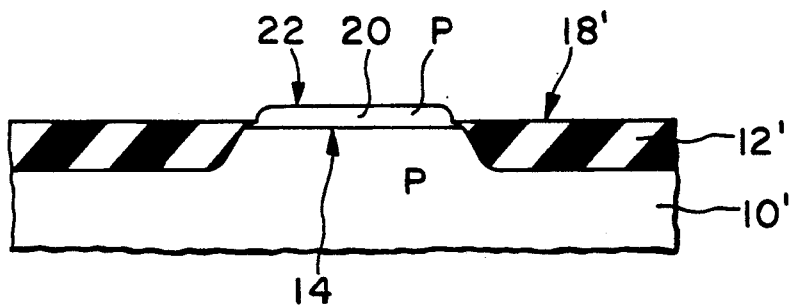
Figure 2D:
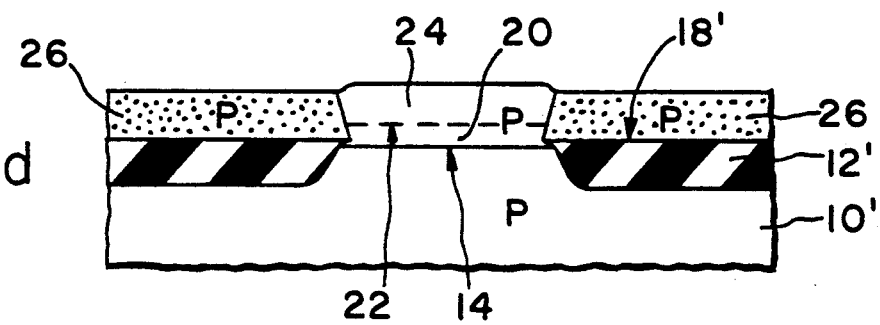

FIG. 2b shows the structure at the end of the cleaning operation in which oxide layer 16 is removed FIG. 2c depicts the structure at the end of the first Si CVD in which first MS epitaxial layer 20 is selectively grown on MS surface 14. Finally, FIG. 2d shows the structure at the end of the second Si CVD in which second MS epitaxial layer 24 and PS layer 26 are respectively grown on MS surface 22 and oxide surface 18'. Layers 20, 24, and 26 again form the composite MS/PS layer whose upper surface is now nearly planar.

Figure 3:
FIG. 3 is a photomicrograph of an actual semiconductor structure fabricated according to the process of FIGS. 2a-2d.

The characteristics of structures manufactured in accordance with the invention are very good. Referring to FIG. 3, it illustrates a cross section of an actual semiconductor structure fabricated according to the process of FIGS. 2a-2d at the preferred conditions given above. More specifically, FIG. 3 corresponds to a portion of the structure at the stage shown in FIG. 2d. As indicated in FIG. 3, interface 14 between substrate region 10' and composite epitaxial portion 20/24 is featureless. Substantially no defects can be seen in portion 20/24.

A transmission electron microscopic analysis performed on the structure shown in FIG. 3 yielded a single set of electron diffraction spots. This shows that epitaxial layer 20/24 has the same lattice constant as substrate region 10' and, consequently, that layer 20/24 is in good vertical alignment with original MS surface 14.

While the invention has been described with reference to particular embodiments, this description is solely for the purpose of illustration it is not be construed as limiting the scope of the invention claimed below. For example, lower values of $T_B$ than the preferred values given above could be used to achieve an even lower thermal budget Although the lowest $T_B$ that can be used in the two-step Si deposition without significantly degrading the monosilicon quality of epitaxial portion 20/24 is not yet known, it appears that a $T_B$ down to 700° C. should be viable. Lower $T_B$ will be accompanied by lower $P_c$.

Instead of field oxide, the dielectric portion of the body on which the MS/PS layer is deposited could be a simple silicon dioxide layer having largely vertical openings through which the MS portion of the body is exposed. In this case, the first deposition step would typically be performed long enough to at least fill the openings with monosilicon By suitably controlling the Si deposition times, the upper surface of the MS/PS layer could be made largely planar.

The PS portion of the MS/PS layer could be deposited on a dielectric other than silicon dioxide Silicon nitride is one possible alternative dielectric. Various modifications and applications may thus be made by those skilled in the art without departing from the true scope and spirit of the invention as defined in the appended claims.

We claim:

1. A method of forming a semiconductor structure from a body comprising a monocrystalline silicon region and an adjoining dielectric region, the method comprising the steps of:
    performing a silicon deposition at an average body temperature less than or equal to 950° C. using a first silicon source to form a first monocrystalline silicon layer on an exposed major surface of the monocrystalline silicon region without simultaneously depositing substantially any silicon on an adjacent exposed major surface of the dielectric region; and
    performing a silicon deposition at an average body temperature less than or equal to 950° C. using a second silicon source of different chemical composition than the first silicon source to form a second monocrystalline silicon layer on an exposed surface of the first monocrystalline silicon layer and to simultaneously form a polycrystalline silicon layer on the exposed major surface of the dielectric region.

2. A method as in claim 1 wherein the performing steps are done at a pressure no more than 50 torr.

3. A method as in claim 2 wherein the performing steps are done in a low-pressure chamber without removing the body from the chamber between the performing steps.

4. A method as in claim 2 including, prior to the first performing step, the step of cleaning the major surface of the monocrystalline silicon region with a silicon etchant.

5. A method as in claim 4 wherein the silicon etchant consists principally of hydrochloric acid.

6. A method as in claim 4 further including, prior to the cleaning step, the step of subjecting the body to an environment consisting principally of hydrogen to break up any silicon dioxide along the major surface of the monocrystalline silicon region.

7. A method as in claim 6 wherein the cleaning and subjecting steps are done at a body temperature no more than about 950° C.

8. A method as in claim 7 wherein the cleaning and subjecting steps are done at a pressure no more than 50 torr.

9. A method as in claim 8 wherein the performing, cleaning, and subjecting steps are done in a low-pressure chamber without removing the body from the chamber between any of these steps.

10. A method as in claim 2 wherein the first performing step is done by chemical vapor deposition using dichlorosilane as the first silicon source.

11. A method as in claim 10 wherein the first performing step includes using a silicon etchant.

12. A method as in claim 11 wherein the silicon etchant consists principally of hydrochloric acid.

13. A method as in claim 10 wherein the second performing, step is done by chemical vapor deposition using silane as the second silicon source.

14. A method as in claim 13 wherein the dielectric region comprises silicon dioxide along at least its major surface.

15. A method as in claim 1 wherein the body temperature is no more than 900° C. during the performing steps.

16. A method as in claim 15 wherein the performing steps are done at a pressure no more than about 50 torr.

17. A method as in claim 1 wherein the body temperature is no more than about 850° C. during the performing steps.

18. A method as in claim 17 wherein the performing steps are done at a pressure no more than about 25 torr.

19. A method as in claim 2 wherein the first performing step is done by chemical vapor deposition using dichlorosilane as the first silicon source, the second performing step is done by chemical vapor deposition using silane as the second silicon source, and the body temperature is no more than 900° C. during the performing steps.

20. A method as in claim 19 wherein the body temperature is no more than about 850° C. during the performing steps.

21. A method as in claim 19 including, prior to the first performing step, the steps of:
    subjecting the body to an environment consisting principally of hydrogen to break up any silicon dioxide along the major surface of the monocrystalline silicon region; and
    subsequently cleaning the major surface of the monocrystalline silicon region with hydrochloric acid.

22. A method as in claim 21 wherein the performing, cleaning, and subjecting steps are done in a low-pressure chamber without removing the body from the chamber between any of these steps.

23. A method as in claim 1 including, subsequent to the second performing step, the step of providing at least one doped zone in the monocrystalline and polycrystalline layers without causing substantially any of the material in the polycrystalline layer to become significantly monocrystalline in nature.

24. A method as in claim 23 further including, subsequent to the providing step, the step of creating an electrical interconnection system over the monocrystalline and polycrystalline layers without causing substantially any of the material in the polycrystalline layer to become significantly monocrystalline in nature.

25. A method as in claim 1 wherein the performing steps are done by chemical vapor deposition using dichlorosilane and the silane respectively as first and second silicon sources.

* * * * *